PATTERN MASK GENERATING METHOD AND APPARATUS

BACKGROUND OF THE INVENTION

This invention relates to methods and apparatus for producing patterns on photosensitive substrates, and relates more particularly to methods and apparatus for generating the different photomasking patterns required for all respective layers of a particular high-density multilayered integrated circuit concurrently under identical environmental conditions to minimize misregistration error.

Mask pattern generating machines currently commerically available employ X-Y stepping of a substrate requiring over thirty hours to complete the exposure of a single mask pattern; and only one pattern can be made at a time. As circuit density increases, this time is expected to increase to over 120 hours per mask, further increasing the likelihood of misregistration errors that can result from changes in ambient conditions occurring from the time the mask for the first layer is started until that for the last layer is completed.

The most pertinent known prior art is U.S. Pat. No. 3,622,742. This patent shows and describes an apparatus in which a modulated laser beam machines, by vaporization, thin films on a plurality of substrates mounted about the periphery of a rotating drum. The beam passes through a lens that is oscillated to change the position of the beam focus to compensate for change in depth of field as the flat-coated surface of the substrate rotates past the beam. The beam is also stepped in an axial direction to impinge successively on different parts of the substrate during successive revolutions of the drum. Code plates are fixed to the periphery of the drum. Each plate has a photosensed timing track and is precisely located by index pins relative to its respective substrate. Clocking pulses for each substrate are thus discontinuous; i.e., they are generated only while a laser beam is passing through slots in a code plate, and hence cannot provide the clock continuity necessary for a high-frequency clocking system required for high-density, fine-resolution circuits.

This cited patent suggests, however, that if desired, the substrates may be mounted on the surface of a disk, rather than the periphery of a drum, and notes that coordinate transformation (such as employed in the present invention) would then be necessary to produce rectilinear patterns. The patent further states that: "Normally all of the circuits to be machined are identical, and if this be the case, the modulation of the beam is identical through each successive substrate that intercepts the beam during one drum rotation." Even if this is construed to imply that the substrates may differ, there clearly is no teaching or even remote suggestion that the substrates would be so related as to fabricate in the same exposing operation all of the photomasks necessary for making a particular multilayered circuit. Moreover, no prior art is known which suggests making all such related masks concurrently in the same exposing operation. Nor is there any teaching of a continuous clock arrangement to insure, with a permissible limited degree of self-regulation, precision registration of patterns on the respective masks.

SUMMARY OF THE INVENTION

The principal object of this invention is to provide an improved method and apparatus for fabricating photomasks for high-density, multilayered integrated circuits in a minimum amount of time and with minimal likelihood of misregistration error.

A plurality of substantially identical, flat substrates having a photosensitive coating are supported on a flat turntable at precise locations uniformly spaced apart both radially and circumferentially. The turntable is rotated at a substantially constant preselected angular velocity. A laser beam or electron beam is incremented radially inward toward the turntable axis once per revolution of the turntable to scan contiguous narrow bands on each substrate sequentially.

A magnetic disk file, tape or other source of digital information provides a series of electrical pulses or bits, each representing successive spots at which exposure of the photosensitive coating is desired according to the particular pattern proposed on each respective layer of the integrated circuit. The light beam is modulated according to said series of bits to cause selective exposure of portions of the incremental bands of the photosensitive coating on each respective substrate sequentially to provide an image on each substrate corresponding to its unique layer pattern, so that at the conclusion of the series of contiguous scans, the masking patterns for all requisite layers will have been completely imaged in parallel under identical environmental conditions.

Another object is to provide a continuous clocking arrangement embodying means for correcting the beam modulation rate, and hence "printing" rate, should slight variations in turntable velocity occur between consecutive rotations. According to this feature, two concentric magnetic clocking tracks are provided. One track provides a base clock (e.g., 5000 bits per inch) which at the preselected velocity generates a string of pulses that are increased tenfold by an oscillator in a phase lock loop circuit to provide continuous high frequency system clocking pulses (e.g., at a rate of 32MHz). The other track provides one index pulse precisely the instant each revolution of the turntable is completed. The phase lock loop circuit and another oscillator that controls turntable velocity cooperate mechanically and electronically to maintain synchronization between the base magnetic clock pulses, the high frequency system clocking pulses and the index pulse. The phase lock loop corrects beam modulation rate if the turntable velocity varies slightly from one revolution to the next. Circuitry hereinafter described initiates a shutdown signal unless a precise preselected number of clocking pulses is generated between each successive index pulse; failure to generate said preselected number of clocking pulses indicates that there is a timing error, as a result of which image spots generated in the scan just completed failed to register with the predetermined precision relative to those in the preceding scan.

Still another object is to provide an improved and simplified means for accurately and quickly achieving dynamic balance of the turntable, which is critical to maintain interlayer registration within very close tolerance (e.g., five microinches).

These and other objects, features and advantages will become apparent from the following more particular description of preferred embodiments thereof as illustrated in the accompanying drawings.

Figure 1:
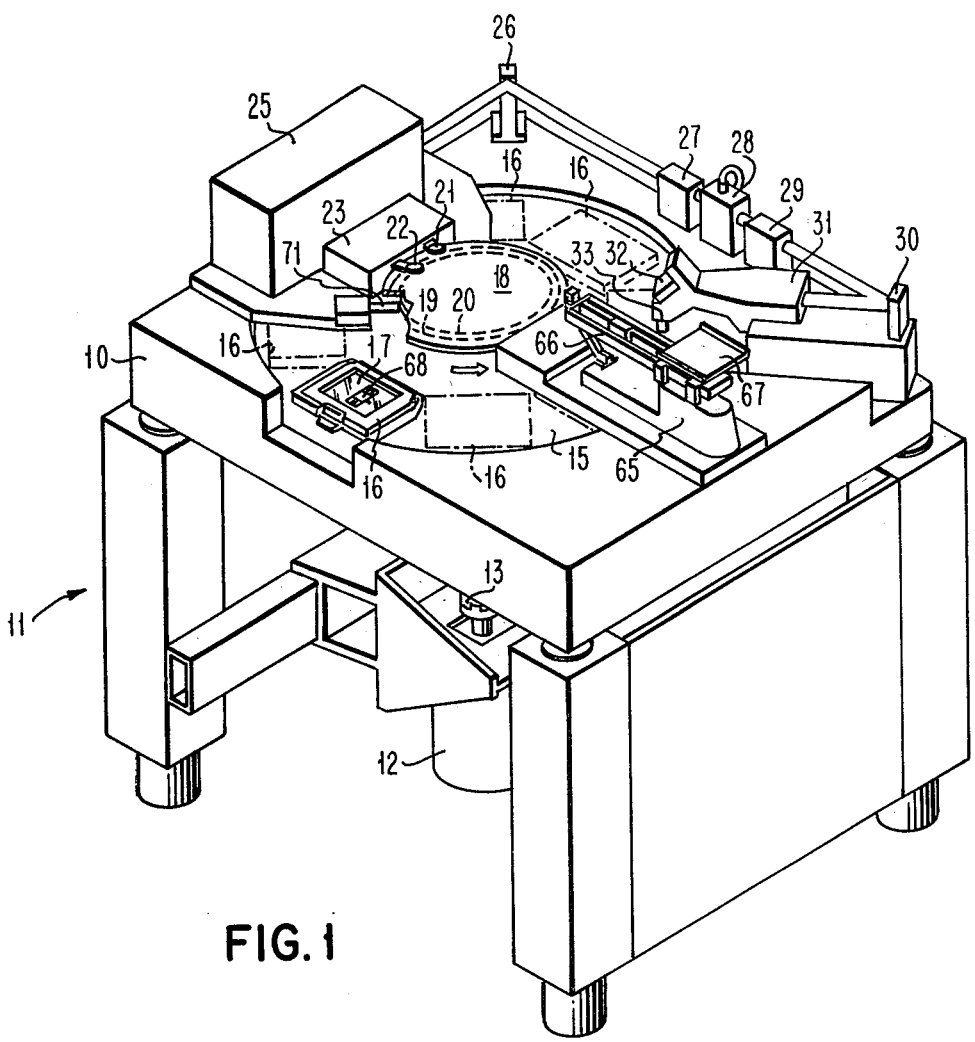
FIG. 1 is a perspective view of a photomask generating apparatus embodying the invention.

thereby enabling all curved lines to be straightened with satisfactory resolution.

The electronic circuitry further comprises a servosystem including a phase lock loop circuit 56, a "divide by $n$" counter 57 and a compare circuit 58. The phase lock loop circuit 56 is of conventional type. It comprises a phase detector (not shown) to which the magnetic clock pulses sensed by read head 21 are supplied at a preselected nominal frequency (e.g., 3.2MHz) as determined by the density of the uniformly spaced magnetized bits on clock track 19 and the preselected angular velocity of turntable 15. The pulses from the phase detector are supplied via a low pass filter (not shown) to a voltage controlled oscillator set to provide a series of high frequency (e.g., 32MHz) system clocking pulses in a line 59. Circuit 56 includes a "divide by $n$" counter (not shown) set to divide by 10, interposed in a feedback loop (not shown) connecting a branch of line 59 with the phase detector. If the frequency of magnetic clock pulses sensed from clock track 19 is higher than the frequency of the pulses fed back by the "divide by 10" counter, the low pass filter will go plus and cause the voltage controlled oscillator to speed up to bring the fed back pulse frequency closer to that of the magnetic clock pulses; and vice versa. In this manner, the beam modulation rate, and hence the "printing" rate, will modify to compensate for slight variations in turntable velocity between consecutive rotations.

Counter 57 is interposed between a branch of line 59 and the compare circuit 58. It thus counts the system clocking pulses and divides that count by a preset number corresponding to the number of system clocking pulses that should occur per rotation of the turntable. Counter 57 will thus provide a signal to compare circuit 58 at that instant when said preset number of system clocking pulses have been counted. This signal should coincide, within a selected "window", with the signal as sensed by index track read head 22 and also fed to compare circuit 58.

If this coincidence occurs, it verifies that the image spots generated in the scan just completed register with the requisite precision relative to the image spots in the preceding scan. If these signals do not coincide, however, a timing error is indicated; i.e., the scan just completed has image spots unacceptably out of registry with those that preceded it, rendering further operation of the pattern generator impractical as the photomasks will be out of matching tolerance. In this event an error signal is generated by circuit 58 in a line 60, branches (not shown) of which are connected to computer 53, control logic circuitry 55, drive motor 12, amplifier 51 and laser 25. This error signal will deactivate computer 53, control logic circuitry 55, laser 25, and amplifier 51 and also actuate a direct-current braking system (not shown) for stopping the motor 12 and hence turntable 15. If no such error signal occurs, the control logic circuitry 55 will operate, after a certain angular displacement past the index bit on track 20, to incrementally step lens holder assembly 31 radially inward a preselected slight degree in readiness for the next contiguous scan. After a full scan is completed, the lens holder assmebly 31 will be incremented radially inward, and the apparatus is programmed to defer exposure during this time interval.

Figure 4:
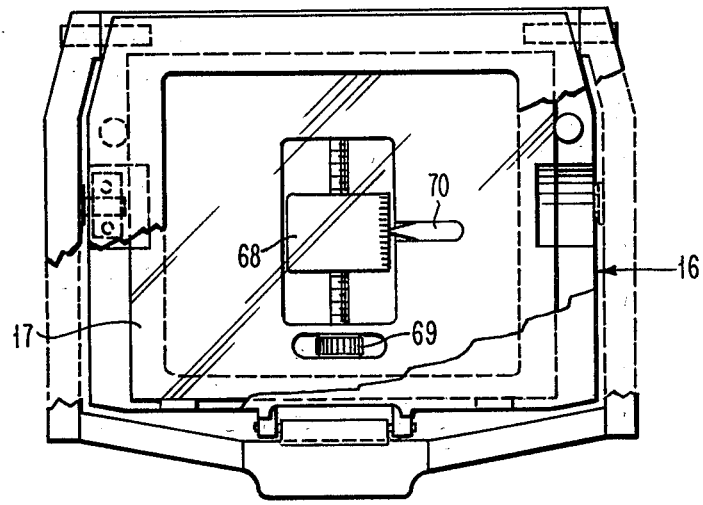

As best illustrated in FIGS. 1 and 4, the apparatus embodying the invention also comprises a simple dynamic balancing mechanism. Supported on base 10 above turntable 15 is a weighing scale 65 (FIG. 1) having a balance beam 66 calibrated in terms of deviation of the substrate weight from a preselected value; this scale may either be in terms of increasing values from a known minimum value or in terms of a plus or minus deviation from a nominal value. In either event, the photosensitive-coated substrate 17 is placed on a platform 67, balanced, and the scale reading noted.

As shown in FIG. 4, slug 68, housed in holder 16, has a calibrated scale inscribed thereon which corresponds to the deviation terms inscribed on balance beam 66 of scale 65. Slug 68 is radially positioned at a precise location at which a stationary pointer 70 is opposite and points to the number (deviation term) that had been noted on balance beam 66. Static balance of turntable 15 and holder 16 are corrected for, since the mass of turntable 15 and holder 16 has been compensated for. All slugs 68 and associated mechanism are equidistant radially with all slugs at the same deviation number (e.g., 4). Hence, after noting the static balance of each substrate 17 as indicated on the balance beam 66, the operator merely rotates a respective thumb wheel 69 as necessary to position each slug 68 at the same deviation term as noted on balance beam 66.

To insure that the operator places a substrate 17 in each holder 16 and/or that he has adjusted each thumb wheel 69 to correct for variation in substrate weight, a runout probe 71 is provided to sense dynamic runout. This probe 71 is associated with circuitry (not shown) to supply to line 60, via suitable OR circuitry, an error signal, similar to the type heretofore described, for stopping motor 12 and turntable 15. The apparatus will remain shut down until the deficiency has been rectified. This feature is essential to minimize runout to insure interlayer mask integrity will be preserved.

After all substrates 17 are inserted in their respective holders 16, there will be a slight static imbalance—especially if there is a maximum variation in substrate weights. However, this static imbalance is minimal. It is compensated to zero as the turntable is rotated to its preselected velocity. These slight differences in weight are minimal from a static standpoint, although at the high preselected velocity of the turntable they are significant from a dynamic standpoint.

Figure 5:
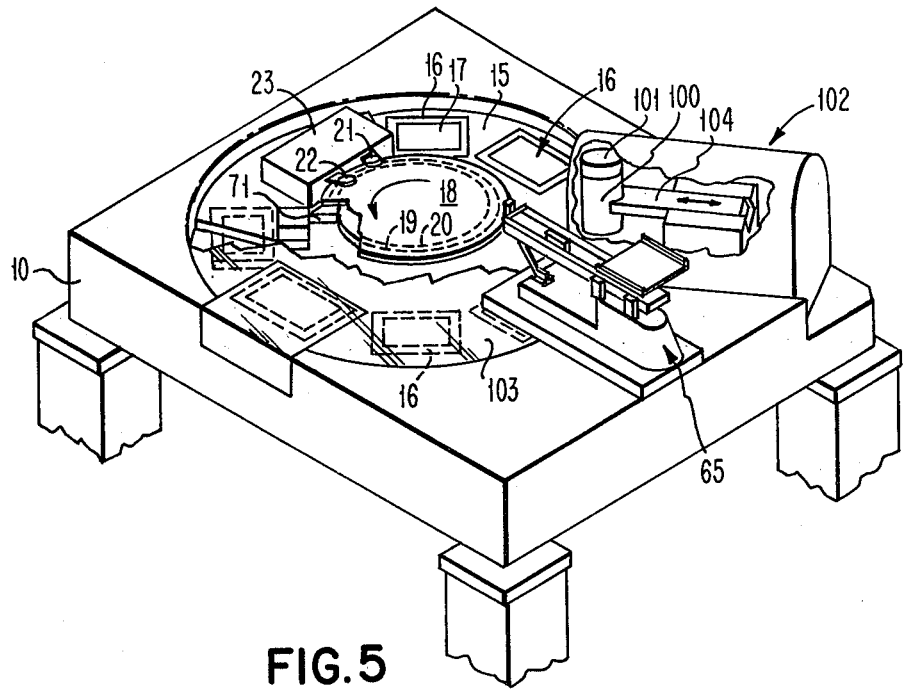
Figure 6:
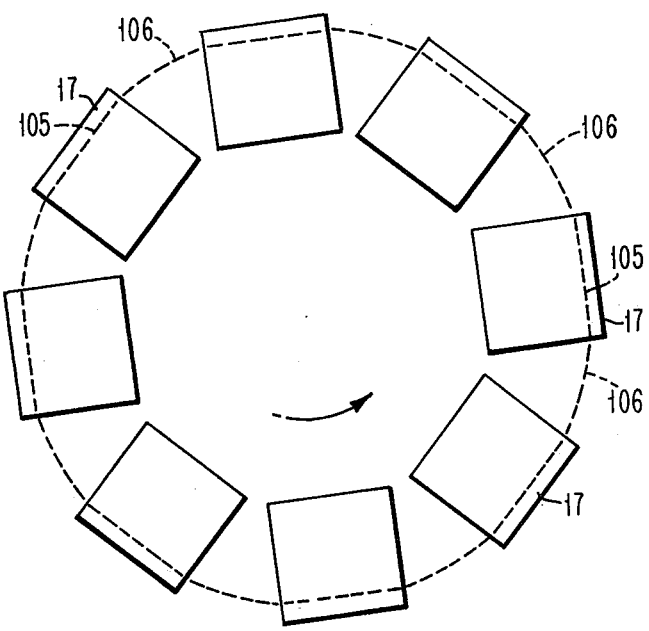

The invention as thus far described has been concerned with exposure of photosensitive coatings by a laser beam. It should be understood, however, that if desired the method and apparatus heretofore described may be modified slightly as indicated in FIGS. 5 and 6 to employ an electron beam (instead of a laser beam) as the exposure energy source.

Figure 3:
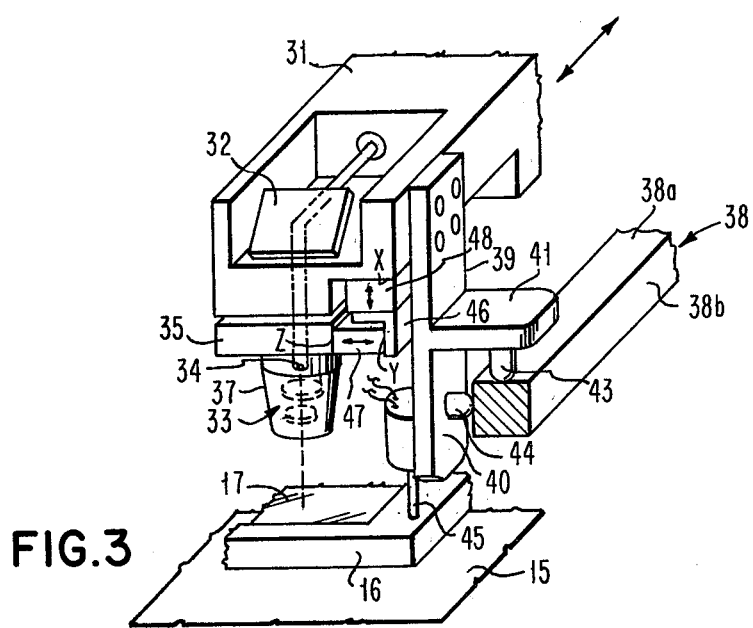
Figure 2:
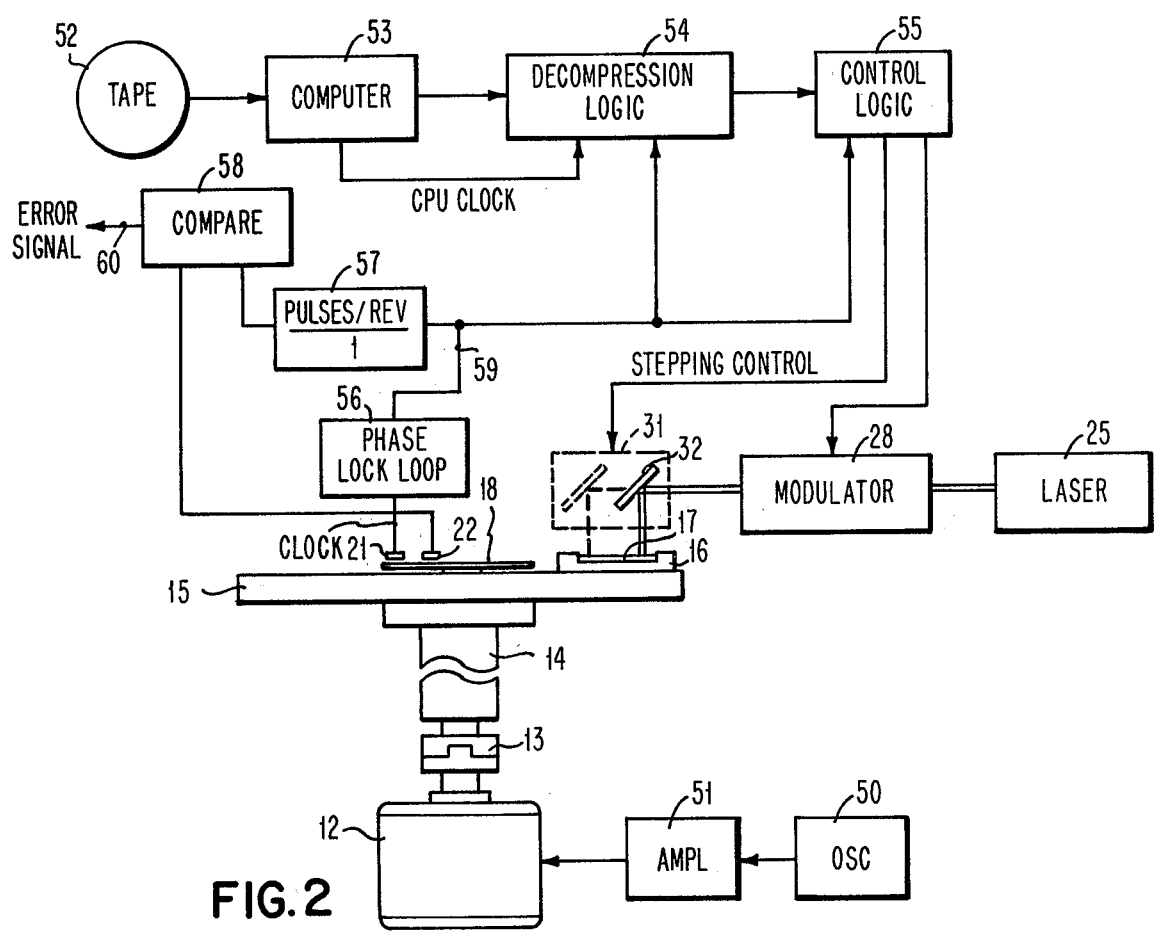

In the modified apparatus illustrated in FIGS. 5 and 6, structure identical with that heretofore described in connection with the laser embodiment of FIGS. 1-3 will be designated by like reference numerals. The modified apparatus differs from that of FIGS. 1-3 in that laser 25 and the other parts 26-33 associated therewith are eliminated; and lens holder assembly 31 is replaced by a source 100 of electron beam energy with which is associated a deflection yoke 101 of the type conventionally used for television tubes for deflecting the electron beam a limited degree. Also, since electron beam energy must be employed in an evacuated atmosphere, the apparatus must be suitably sealed by a cover 102 over source 100 and a cover 103 for turntable 15; the area enclosed by said covers being connected to a suitable vacuum source (not shown). The source 100 (such as an electron beam gun) is mounted on a Y-slide 104 and incremented radially in substantially the same manner as described in connection with the laser embodiment of FIGS. 1–3.

The electron beam embodiment has certain advantages. The deflection yoke 101 is controlled in conventional manner by suitable hard wired logic circuitry (not shown) so as to deflect the electron beam electrostatically to provide a chord-like scan 105 (FIG. 6) as each substrate 17 passes thereunder, returning to a normal curved path (i.e., a concentric scan) between substrates, as indicated at 106. This deflection yoke control desirably eliminates the special programming needed in the embodiment of FIGS. 1–3 to effect the polar coordinate rectification to convert X-Y data into polar coordinate (R,θ) data. It also eliminates the need for maintaining a lens, like 33, constantly perpendicular to the substrate and in critical focus, such as is required when using a laser beam because of its limited focal range.

The term "fine resolution energy medium," as used in the claims, is therefore intended generically to cover both a laser beam and an electron beam, inasmuch as the invention, as broadly defined herein, may be implemented with either.

It should be understood that this apparatus and method may be used to make either positive or negative patterns. To make a positive pattern, as heretofore assumed, the X-Y digital data bits normally would be a "0" but be a "1" whenever the laser or electron beam is to be turned on to expose the photosensitive coating. To make a negative pattern, the X-Y digital data bits normally would be a "1" but be a "0" whenever the laser or electron beam is to be turned on to expose the coating.

While the invention has been particularly shown and described with reference to preferred embodiments thereof, it will be understood by those skilled in the art that various changes in form and detail, including but not limited to those above suggested, may be made therein without departing from the spirit, scope and teaching of the invention. Accordingly, the apparatus and method herein disclosed are to be considered merely as illustrative and the invention is to be limited only as specified in the claims.

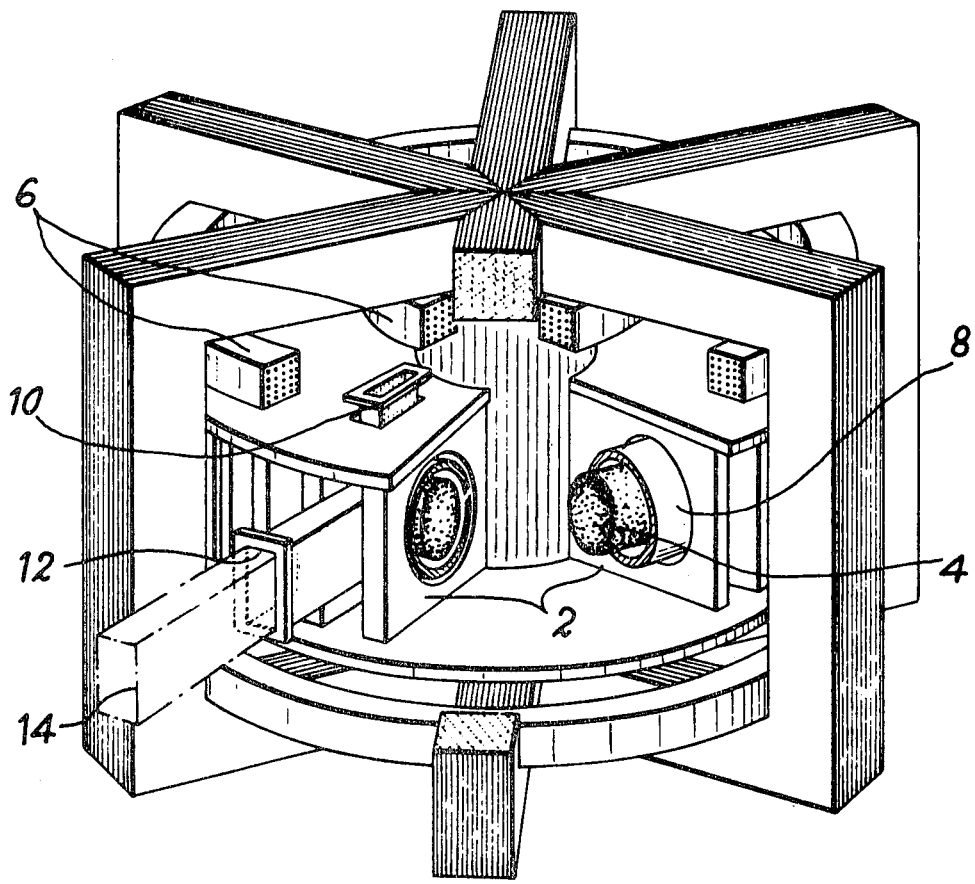

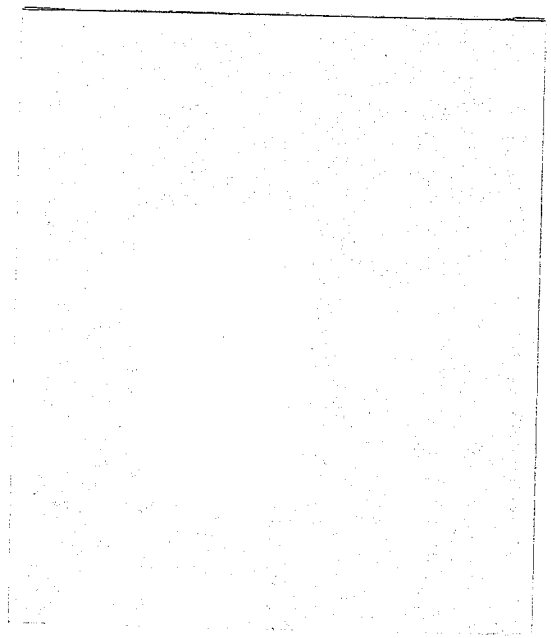

What is claimed is:

1. A method for generating a set of photomasks for a multilayered integrated circuit, comprising the steps of:
    supporting a plurality of substrates with photosensitive coatings on a turntable at substantially equal radial and circumferential distances relative to the axis of rotation;
    rotating the turntable at substantially a preselected constant velocity;
    providing an input medium having encoded indicia thereon representing that necessary to make all the masks for the different layers of the multilayered circuit;
    directing a fine resolution energy medium toward the turntable and moving the medium incrementally in a radial direction relative to the turntable to scan successive contiguous bands of each substrate coating sequentially during successive rotations of the turntable;
    modulating the fine resolution energy medium under control of the encoded indicia so as to control selective exposure of incremental portions of the coating on each substrate in a series of contiguous narrow scans as the energy medium is incremented radially relative to the rotating turntable, to provide a unique image pattern on each substrate corresponding to that required for a respective one of the masks necessary for fabricating a different layer of the multilayered integrated circuit, so that the masks for all requisite layers will be completely imaged substantially concurrently under identical environmental conditions and with minimal misregistration during a series of continuous successive rotations of the turntable; and
    controlling the incremental radial movement of the medium and frequency of modulation with a continuous high frequency clocking system having a closed loop feedback.

2. The method according to claim 1, wherein the spot size of the fine resolution energy medium is at least five times smaller than the smallest image element in any image pattern, and including the step of:
    coverting rectangular coordinate positions of each substrate while it is supported in a respective predetermined position on the turntable, into polar coordinates, thereby substantially to square up and render substantially parallel the opposite edges of the respective image elements to correct for radial and concentric distortion due to rotation of the turntable relative to the energy medium.

3. The method according to claim 1, including the step of:
    dynamically balancing the turntable by adjusting the respective radial positions of each of a plurality of predetermined identical masses, one associated with each substrate, to dynamically compensate for inertia changes due to the variations in weight of the respective photosensitive-coated substrates.

4. The method according to claim 1, including the steps of:
    weighing each photosensitive-coated substrate, prior to supporting it on the turntable, to determine its deviation from a preselected weight, and
    providing at each substrate-supporting location a slug which is movable radially relative to the axis of rotation of the turntable by turning a respective thumb wheel to position the slug radially at a position corresponding to the magnitude of such deviation for dynamically balancing the turntable.

5. The method according to claim 1, wherein the controlling step includes:
    generating a continuous series of high frequency clocking pulses and a single index pulse during every rotation of the turntable;
    counting said clocking pulses; and
    generating a shutdown signal for initiating a shutdown operation unless a preselected number of clocking pulses corresponding to the number that should be generated during every revolution of the turntable are counted between successive index pulses for terminating the mask generation process when clocking pulse frequency variation would result in unacceptable misregistration of the masks for the respective different layers of the multilayer integrated circuit.

6. The method according to claim 5 wherein the controlling step further includes:
    modifying the frequency of the clocking pulses, as with phase lock loop circuitry, to compensate for slight variations in turntable velocity during successive rotations of the turntable.

7. The method according to claim 1 wherein the energy medium is an electron beam, and including the step of:
    electrostatically deflecting the beam as each substrate passes through the path of the beam to generate patterns in rectilinear format on the mask without need for programming.

* * * * *

United States Patent [19]
Brambilla et al.

[11] 4,110,595
[45] Aug. 29, 1978

[54] HIGH-FREQUENCY PLASMA-HEATING APPARATUS

[75] Inventors: Marco Brambilla, St. Egreve; Pascal Lallia, Grenoble, both of France

[73] Assignee: The United States of America as represented by the United States Department of Energy, Washington, D.C.

[21] Appl. No.: 588,583

[22] Filed: Jun. 19, 1975

[51] Int. Cl.² .............................................. G21B 1/00
[52] U.S. Cl. .................................. 219/121 P; 176/3
[58] Field of Search .................... 219/121 P; 176/1, 3; 313/231.3; 315/39, 39.51, 111, 111.2, 111.7; 333/31 A, 98 R, 99 PL; 343/777, 778

[56] References Cited

U.S. PATENT DOCUMENTS

| | | | |
|---|---|---|---|
| 3,027,557 | 3/1962 | Gent | 343/778 |
| 3,218,580 | 11/1965 | Zanichkowsky | 343/778 X |
| 3,500,422 | 3/1970 | Cheston et al. | 343/778 |
| 3,755,760 | 8/1973 | Ohm | 333/31 A |
| 3,778,343 | 12/1973 | Coppi et al. | 176/3 |
| 3,801,939 | 4/1974 | Lamy et al. | 333/98 R X |

*Primary Examiner*—J. V. Truhe
*Assistant Examiner*—Clifford C. Shaw
*Attorney, Agent, or Firm*—Dean E. Carlson; R. G. Erdley; William R. Woodward

[57] ABSTRACT

An array of adjacent wave guides feed high-frequency energy into a vacuum chamber in which a toroidal plasma is confined by a magnetic field, the wave guide array being located between two toroidal current windings. Waves are excited in the wave guide at a frequency substantially equal to the lower frequency hybrid wave of the plasma and a substantially equal phase shift is provided from one guide to the next between the waves therein. For plasmas of low peripheral density gradient, the guides are excited in the $TE_{01}$ mode and the output electric field is parallel to the direction of the toroidal magnetic field. For exciting waves in plasmas of high peripheral density gradient, the guides are excited in the $TM_{01}$ mode and the magnetic field at the wave guide outlets is parallel to the direction of the toroidal magnetic field. The wave excited at the outlet of the wave guide array is a progressive wave propagating in the direction opposite to that of the toroidal current and is, therefore, not absorbed by so-called "runaway" electrons.

7 Claims, 4 Drawing Figures